(12) United States Patent
Lin et al.

(10) Patent No.: US 8,394,688 B2
(45) Date of Patent: Mar. 12, 2013

(54) PROCESS FOR FORMING REPAIR LAYER AND MOS TRANSISTOR HAVING REPAIR LAYER

(75) Inventors: Chien-Liang Lin, Taoyuan County (TW); Ying-Wei Yen, Miaoli County (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 1 day.

(21) Appl. No.: 13/169,129

(22) Filed: Jun. 27, 2011

(65) Prior Publication Data

US 2012/0326162 A1 Dec. 27, 2012

(51) Int. Cl.
*H01L 21/336* (2006.01)
*H01L 21/8234* (2006.01)

(52) U.S. Cl. .................. 438/197; 438/595; 257/E21.64

(58) Field of Classification Search .................. 438/197, 438/595; 257/E21.64
See application file for complete search history.

(56) References Cited

U.S. PATENT DOCUMENTS

| | | | |
|---|---|---|---|
| 5,188,978 A * | 2/1993 | deSouza et al. ............... 438/181 |
| 5,296,411 A | 3/1994 | Gardner et al. | |
| 5,591,681 A | 1/1997 | Wristers et al. | |
| 6,110,842 A | 8/2000 | Okuno et al. | |
| 6,165,846 A | 12/2000 | Carns et al. | |
| 6,245,689 B1 | 6/2001 | Hao et al. | |
| 6,268,251 B1 | 7/2001 | Zhong et al. | |
| 6,335,248 B1 * | 1/2002 | Mandelman et al. ......... 438/279 |
| 6,358,865 B2 | 3/2002 | Pearce et al. | |
| 6,461,984 B1 | 10/2002 | Han et al. | |
| 6,468,915 B1 | 10/2002 | Liu | |
| 6,492,217 B1 | 12/2002 | Bai et al. | |
| 6,548,366 B2 | 4/2003 | Niimi et al. | |
| 6,590,344 B2 | 7/2003 | Tao et al. | |
| 6,627,463 B1 | 9/2003 | Sarfaty | |
| 6,632,747 B2 | 10/2003 | Niimi et al. | |
| 6,639,264 B1 | 10/2003 | Loh | |
| 6,649,538 B1 | 11/2003 | Cheng et al. | |
| 6,667,251 B2 | 12/2003 | McFadden et al. | |
| 6,706,644 B2 | 3/2004 | Burnham et al. | |
| 6,723,663 B1 | 4/2004 | Wieczorek et al. | |
| 6,737,362 B1 | 5/2004 | Chen et al. | |
| 6,881,657 B2 * | 4/2005 | Torii et al. ..................... 438/591 |
| 7,091,119 B2 | 8/2006 | Colombo | |
| 7,138,691 B2 | 11/2006 | Burnham et al. | |
| 7,176,094 B2 | 2/2007 | Zhong et al. | |
| 7,186,608 B2 | 3/2007 | Moore et al. | |
| 7,429,538 B2 | 9/2008 | Olsen | |
| 2002/0190302 A1 | 12/2002 | Bojarczuk et al. | |
| 2003/0109146 A1 | 6/2003 | Colombo et al. | |
| 2003/0134461 A1 * | 7/2003 | Su et al. ......................... 438/197 |
| 2003/0157771 A1 * | 8/2003 | Luoh et al. ..................... 438/287 |
| 2004/0029328 A1 | 2/2004 | Lahaug | |

(Continued)

*Primary Examiner* — Charles Garber
*Assistant Examiner* — Ron Pompey
(74) *Attorney, Agent, or Firm* — Ding Yu Tan

(57) ABSTRACT

A repair layer forming process includes the following steps. Firstly, a substrate is provided, and a gate structure is formed on the substrate, wherein the gate structure at least includes a gate dielectric layer and a gate conductor layer. Then, a nitridation process is performed to form a nitrogen-containing superficial layer on a sidewall of the gate structure. Then, a thermal oxidation process is performed to convert the nitrogen-containing superficial layer into a repair layer. Moreover, a metal-oxide-semiconductor transistor includes a substrate, a gate dielectric layer, a gate conductor layer and a repair layer. The gate dielectric layer is formed on the substrate. The gate conductor layer is formed on the gate dielectric layer. The repair layer is at least partially formed on a sidewall of the gate conductor layer.

19 Claims, 3 Drawing Sheets

U.S. PATENT DOCUMENTS

| | | |
|---|---|---|
| 2004/0070046 A1 | 4/2004 | Niimi |
| 2005/0003618 A1 | 1/2005 | Kanda |
| 2005/0064109 A1 | 3/2005 | Chen et al. |
| 2006/0148179 A1 | 7/2006 | Wang et al. |
| 2006/0172473 A1 | 8/2006 | Cheng et al. |
| 2006/0172554 A1 | 8/2006 | Wang et al. |
| 2006/0194423 A1 | 8/2006 | Lim et al. |
| 2006/0194446 A1 | 8/2006 | Beaman et al. |
| 2006/0246739 A1 | 11/2006 | Wang et al. |
| 2006/0280876 A1 | 12/2006 | Yen et al. |
| 2007/0082445 A1 | 4/2007 | Yang et al. |
| 2007/0082503 A1 | 4/2007 | Wang et al. |
| 2007/0093013 A1 | 4/2007 | Chua et al. |
| 2007/0169696 A1 | 7/2007 | Olsen |
| 2008/0093639 A1* | 4/2008 | Kim ............... 257/288 |
| 2008/0124861 A1* | 5/2008 | Lin et al. ............... 438/232 |
| 2008/0157231 A1 | 7/2008 | Wang et al. |
| 2009/0273036 A1* | 11/2009 | Horstmann et al. ............ 257/369 |
| 2010/0087052 A1* | 4/2010 | Xu ............... 438/530 |
| 2011/0065262 A1* | 3/2011 | Kamioka et al. ............... 438/468 |
| 2011/0127617 A1* | 6/2011 | Scheiper et al. ............... 257/402 |

\* cited by examiner

PROCESS FOR FORMING REPAIR LAYER AND MOS TRANSISTOR HAVING REPAIR LAYER

FIELD OF THE INVENTION

The present invention relates to a process for forming a repair layer and a MOS transistor having a repair layer, and more particularly to a process for forming a repair layer on a sidewall of a gate structure and a MOS transistor having a repair layer on a sidewall of a gate structure thereof.

BACKGROUND OF THE INVENTION

As the demand on the device integration is gradually increased, the size of the transistor mounted on the semiconductor chip becomes smaller and smaller. However, the size reduction may impair the performance of the transistor, for example the on-state current (Ion) of the transistor is too low and the gate leakage current (Jg) of the transistor is too high. Therefore, there is a need of effectively enhancing the performance of the transistor without increasing the size thereof.

SUMMARY OF THE INVENTION

In accordance with an aspect, the present invention provides a repair layer forming process. Firstly, a substrate is provided, and a gate structure is formed on the substrate, wherein the gate structure at least includes a gate dielectric layer and a gate conductor layer. Then, a nitridation process is performed to form a nitrogen-containing superficial layer on a sidewall of the gate structure. Then, a thermal oxidation process is performed to convert the nitrogen-containing superficial layer into a repair layer.

In an embodiment, the substrate is made of silicon, the gate dielectric layer is made of silicon oxide, silicon nitride or silicon oxynitride, and the gate conductor layer is made of polysilicon.

In an embodiment, the nitridation process is a decoupled plasma nitridation process.

In an embodiment, the decoupled plasma nitridation process is performed in a pressure of 5 mTorr to 15 mTorr with electron energy of 1000 Watt to 2400 Watt for a time period of 25 seconds to 45 seconds.

In an embodiment, the thermal oxidation process is a wet rapid thermal oxidation process or a dry rapid thermal oxidation process.

In an embodiment, the thermal oxidation process is carried out at a temperature in a range of 800° C. to 900° C.

In an embodiment, the thermal oxidation process is a furnace oxidation process.

In an embodiment, the furnace oxidation process carried out at a temperature in a range of 700° C. to 800° C.

In an embodiment, the thickness of the repair layer is in a range of 10 angstroms to 20 angstroms.

In an embodiment, the repair layer is a silicon oxynitride layer.

In an embodiment, the repair layer forming process further includes steps of forming a first spacer on a sidewall of the repair layer, forming a dummy spacer on a sidewall o the first spacer, and forming a second spacer on a sidewall of the dummy spacer.

In an embodiment, the first spacer is a silicon nitride layer with a thickness in range of 50 angstroms to 100 angstroms, the dummy spacer is a multi-layered structure comprising a silicon oxide layer with a thickness in range of 25 angstroms to 75 angstroms and a silicon nitride layer with a thickness in range of 200 angstroms to 400 angstroms, and the second spacer is a multi-layered structure with a total thickness in range of 200 angstroms to 400 angstroms.

In accordance with another aspect, the present invention provides a metal-oxide-semiconductor (MOS) transistor. The metal-oxide-semiconductor transistor includes a gate dielectric layer, a gate conductor layer and a repair layer. The gate dielectric layer is formed on a substrate. The gate conductor layer is formed on the gate dielectric layer. The repair layer is at least partially formed on a sidewall of the gate conductor layer, and the repair layer is made of silicon oxynitride layer.

In an embodiment, the substrate is made of silicon, the gate dielectric layer is made of silicon oxide, silicon nitride or silicon oxynitride, and the gate conductor layer is made of polysilicon.

In an embodiment, the thickness of the repair layer is in a range of 10 angstroms to 20 angstroms.

In an embodiment, the nitrogen content of the silicon oxynitride layer is in a range of 5% to 40%.

In an embodiment, the metal-oxide-semiconductor transistor further includes a first spacer and a lightly doped drain region. The first spacer is formed on a sidewall of the repair layer. The dummy spacer is formed on a sidewall of the first spacer. The second spacer is formed on a sidewall of the first spacer. The lightly doped drain region is formed in the substrate and aligned with the first spacer, wherein the width of the lightly doped drain region is substantially identical to the width of the first spacer.

In an embodiment, the first spacer is a silicon nitride layer with a thickness in range of 50 angstroms to 100 angstroms, the dummy spacer is a multi-layered structure comprising a silicon oxide layer with a thickness in range of 25 angstroms to 75 angstroms and a silicon nitride layer with a thickness in range of 200 angstroms to 400 angstroms, and the second spacer is a multi-layered structure with a total thickness in range of 200 angstroms to 400 angstroms.

In an embodiment, the metal-oxide-semiconductor transistor further includes source/drain regions, which are formed in the substrate and made of silicon germanium (SiGe) or silicon carbide (SiC).

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a process of forming a repair layer and a metal-oxide-semiconductor (MOS) transistor with such a repair layer. For clarification, the present invention is illustrated by referring to a gate structure. Nevertheless, the present invention is not restricted to the gate structure.

Figure 1A:
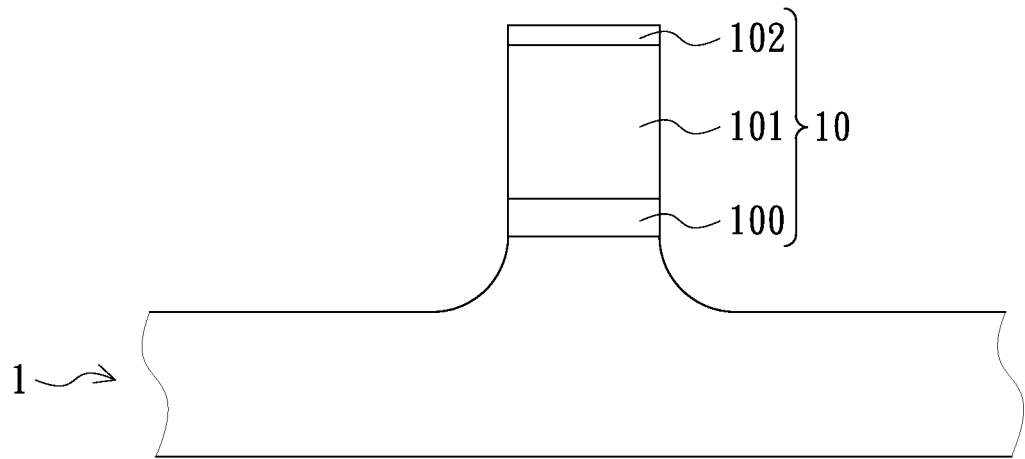
FIG. 1A schematically illustrates a gate structure of a MOS transistor according to an embodiment of the present invention.
Figure 1B:
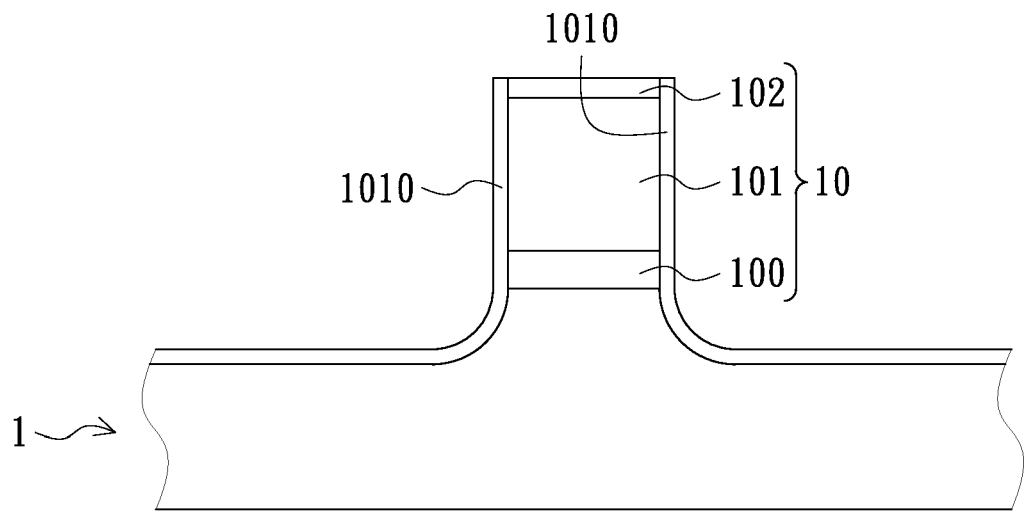
FIG. 1B schematically illustrates a silicon oxide layer formed on a sidewall of the gate conductor layer of the gate structure as shown in FIG. 1A.

Hereinafter, a repair layer forming method according to an embodiment of the present invention will be illustrated with reference to FIGS. 1A and 1B. FIG. 1A schematically illustrate a gate structure of a MOS transistor according to an embodiment of the present invention. Firstly, a silicon substrate 1 is provided. Then, a gate structure 10 including a gate dielectric layer 100, a gate conductor layer 101 and a hard mask layer 102 is formed on the silicon substrate 1. For example, the gate conductor layer 101 is made of polysilicon, and the gate dielectric layer 100 is made of silicon oxide, silicon nitride or silicon oxynitride.

Generally, since a polysilicon layer is etched during the process of defining the gate conductor layer 101, the sidewall is readily suffered from defects. For repairing the defects, before a subsequent LDD (lightly doped drain) formation process is performed, a re-oxidation process is performed to form a silicon oxide layer 1010 on the sidewall of the gate conductor layer 101 by furnace oxidation (see FIG. 1B). For example, the re-oxidation process is carried out at a temperature of about 750° C., and the thickness of the silicon oxide layer 1010 is about 15 angstroms. Moreover, since the arrangement of the silicon oxide layer 1010 may prevent from thickening the interface between the gate dielectric layer 100 and the gate conductor layer 101, the device performance will be increased.

Figure 2A:
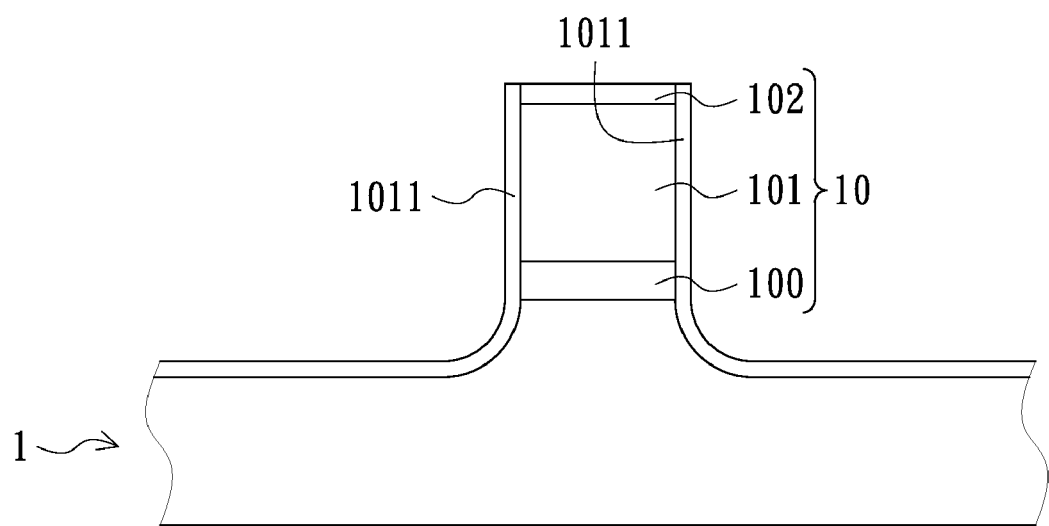
FIG. 2A schematically illustrates a nitrogen-containing superficial layer formed on the sidewall of the gate conductor layer and the surface of the substrate according to another embodiment of the present invention.

For further enhancing the device performance, the present invention also provides another embodiment. Hereinafter, a repair layer forming method according to another embodiment of the present invention will be illustrated with reference to FIGS. 2A, 2B and 2C. Firstly, the resulting structure of FIG. 1A is provided. Then, a decoupled plasma nitridation (DPN) process is performed to form a nitrogen-containing superficial layer 1011 on the sidewall of the gate conductor layer 101 and over the surface of the substrate 1 (FIG. 2A). In an embodiment, the decoupled plasma nitridation process for forming the nitrogen-containing superficial layer 1011 is performed in a pressure of 5 mTorr to 15 mTorr with electron energy of 1000 Watt to 2400 Watt for a time period of 25 seconds to 45 seconds. Moreover, the thickness of the nitrogen-containing superficial layer 1011 is in a range of 10 angstroms to 20 angstroms.

Figure 2B:
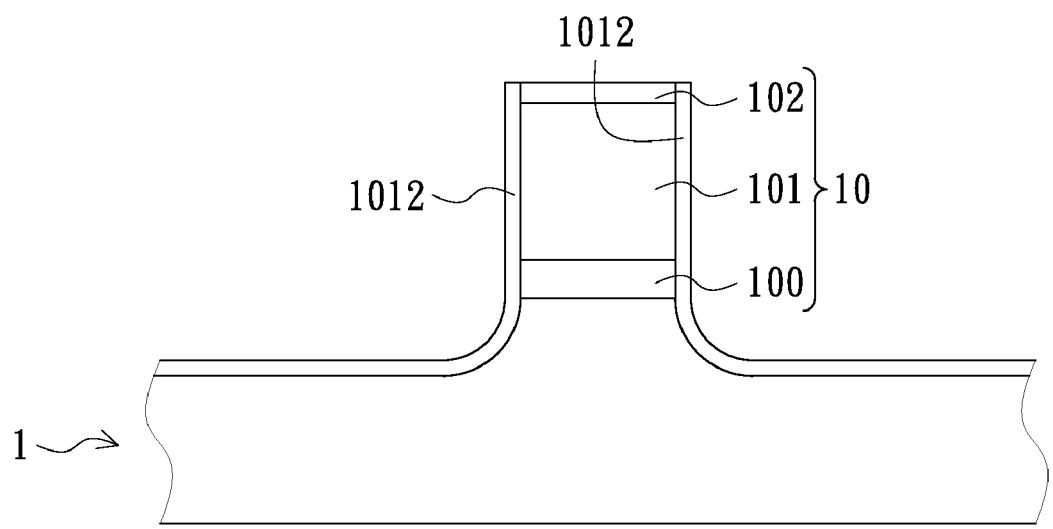
FIG. 2B schematically illustrates a nitrogen-containing superficial layer formed on a sidewall of the gate structure.

Then, as shown in FIG. 2B, a thermal oxidation process is performed to form a repair layer 1012 on the gate structure 10 having the nitrogen-containing superficial layer 1011. The repair layer 1012 is made of silicon oxynitride. The thickness of the repair layer 1012 is in a range of 10 angstroms to 20 angstroms. Preferably, the thickness of the repair layer 1012 is 15 angstroms. Moreover, the nitrogen content of the silicon oxynitride-based repair layer 1012 is in a range of 5% to 40%. Experiments show that the use of the repair layer 1012 is effective to repair the defects of the sidewall of the gate conductor layer 101. When compared with the silicon oxide layer 1010 (FIG. 1B), the repair layer 1012 can provide more stress to the transistor channel. Moreover, the nitrogen atoms of the repair layer 1012 can replenish the dopant diffusion loss of the polysilicon, so that the polysilicon depletion effect of the gate conductor layer 101 is reduced. In a case that the gate dielectric layer 100 is made of silicon oxynitride, the silicon oxynitride-based repair layer 1012 may replenish the lost nitrogen atoms of the gate dielectric layer 100. As a consequence, the dielectric constant of the gate dielectric layer 100 is increased, and the device performance is enhanced. For example, the time-dependent dielectric breakdown (TDDB) result is satisfactory. In an embodiment, the thermal oxidation process is a wet rapid thermal oxidation (RTO) process carried out at a temperature in a range of 800° C. to 900° C. Alternatively, the thermal oxidation process is a dry rapid thermal oxidation carried out at a temperature in a range of 800° C. to 900° C. Alternatively, the thermal oxidation process is a furnace oxidation process carried out at a temperature in a range of 700° C. to 800° C.

Figure 2C:
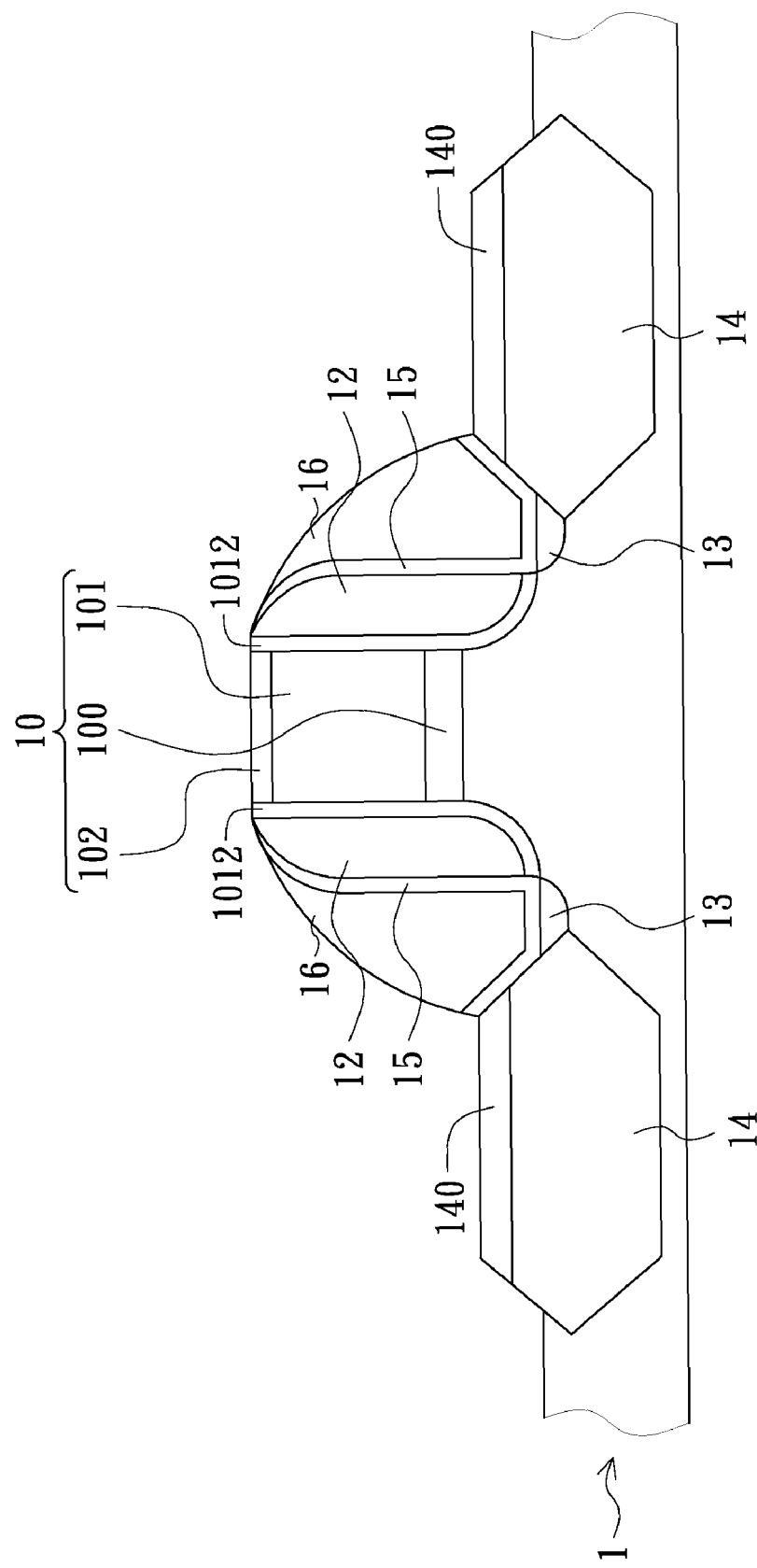
FIG. 2C schematically illustrates a LDD region and source/drain regions formed in the substrate.

Then, as shown in FIG. 2C, a first spacer 12 is formed on a sidewall of the repair layer 1012. In addition, by means of the spacers 12 and the gate structure 10 to define source/drain regions 13 in the substrate 1. The LDD region 13 is aligned with the first spacer 12. Next, the source/drain regions 14 are made of silicon germanium (SiGe) or silicon carbide (SiC) which is formed by an epitaxial process. Moreover, the width of the LDD region 13 is substantially identical to the width of the first spacer 12. Then, a mask layer (not shown), such as silicon oxynitride, is formed on the gate structure 10 and the substrate 1, and the thickness of the mask layer is in a range from 150 angstroms to 250 angstroms. Then, a recess (not shown) is formed in the substrate 1 by self-alignment etching process. Thus there is a distance between the recess and the first spacer 12, the distance is equal to the thickness of the mask layer. Next, the SiGe or SiC is grown in the recess by an epitaxial process and the height of the SiGe or SiC is higher than the surface of the substrate 1 to form the source/drain regions 14 for the MOS transistor in an P-type MOS transistor or in an N-type MOS transistor. Finally, the mask layer is removed. Then, a dummy spacer 15 is formed on a sidewall of the first spacer 12, and a second spacer 16 is formed on a sidewall of the dummy spacer 15. In an embodiment, the first spacer 12 is a silicon nitride layer with a thickness in range of 50 angstroms to 100 angstroms. Moreover, the dummy spacer 15 is a multi-layered structure comprising a silicon oxide layer with a thickness in a range of 25 angstroms to 75 angstroms and a silicon nitride with a thickness in range of 200 angstroms to 400 angstroms. In addition, a Si cap layer 140 is formed on the surface of the SiGe or SiC as shown in FIG. 2C.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A repair layer forming process, comprising steps of:
   providing a substrate, and forming a gate structure on the substrate, wherein the gate structure at least comprises a gate dielectric layer and a gate conductor layer;
   performing a nitridation process to form a nitrogen-containing superficial layer on a sidewall of the gate structure;
   performing a thermal oxidation process to convert the nitrogen-containing superficial layer into a repair layer;
   forming a first spacer on a sidewall of the repair layer; and
   forming an additional spacer on a sidewall of the first spacer, wherein the first spacer is a silicon nitride layer with a thickness in a range of 50 angstroms to 100 angstroms, the additional spacer is a multi-layered structure comprising a silicon oxide layer with a thickness in a range of 25 angstroms to 75 angstroms and a silicon nitride layer with a thickness in a range of 200 angstroms to 400 angstroms.

2. The repair layer forming process according to claim 1, wherein the substrate is made of silicon, the gate dielectric layer is made of silicon oxide, silicon nitride or silicon oxynitride, and the gate conductor layer is made of polysilicon.

3. The repair layer forming process according to claim 1, wherein the nitridation process is a decoupled plasma nitridation process.

4. The repair layer forming process according to claim 3, wherein the decoupled plasma nitridation process is performed in a pressure of 5 mTorr to 15 mTorr with electron energy of 1000 Watt to 2400 Watt for a time period of 25 seconds to 45 seconds.

5. The repair layer forming process according to claim 1, wherein the thermal oxidation process is a wet rapid thermal oxidation process or a dry rapid thermal oxidation process.

6. The repair layer forming process according to claim 5, wherein the thermal oxidation process is carried out at a temperature in a range of 800° C. to 900° C.

7. The repair layer forming process according to claim 1, wherein the thermal oxidation process is a furnace oxidation process.

8. The repair layer forming process according to claim 7, wherein the furnace oxidation process carried out at a temperature in a range of 700° C. to 800° C.

9. The repair layer forming process according to claim 1, wherein the thickness of the repair layer is in a range of 10 angstroms to 20 angstroms.

10. The repair layer forming process according to claim 1, wherein the repair layer is a silicon oxynitride layer.

11. The repair layer forming process according to claim 1, further comprising a step of:
forming a second spacer on a sidewall of the additional spacer.

12. The repair layer forming process according to claim 11, wherein the additional spacer is a dummy spacer.

13. A metal-oxide-semiconductor transistor, comprising:
a gate dielectric layer formed on a substrate;
a gate conductor layer formed on the gate dielectric layer;
a repair layer at least partially formed on a sidewall of the gate conductor layer, wherein the repair layer is a silicon oxynitride layer;
a first spacer formed on a sidewall of the repair layer; and
an additional spacer formed on a sidewall of the first spacer, wherein the first spacer is a silicon nitride layer with a thickness in a range of 50 angstroms to 100 angstroms, the additional spacer is a multi-layered structure comprising a silicon oxide layer with a thickness in a range of 25 angstroms to 75 angstroms and a silicon nitride layer with a thickness in range of 200 angstroms to 400 angstroms.

14. The metal-oxide-semiconductor transistor according to claim 13, wherein the substrate is made of silicon, the gate dielectric layer is made of silicon oxide, silicon nitride or silicon oxynitride, and the gate conductor layer is made of polysilicon.

15. The metal-oxide-semiconductor transistor according to claim 13, wherein the thickness of the repair layer is in a range of 10 angstroms to 20 angstroms.

16. The metal-oxide-semiconductor transistor according to claim 13, wherein the nitrogen content of the silicon oxynitride layer is in a range of 5% to 40%.

17. The metal-oxide-semiconductor transistor according to claim 13, further comprising:
a lightly doped drain region formed in the substrate and aligned with the first spacer, wherein the width of the lightly doped drain region is substantially identical to the width of the first spacer; and
a second spacer formed on a sidewall of the additional spacer.

18. The metal-oxide-semiconductor transistor according to claim 13, wherein the additional spacer is a dummy spacer.

19. The metal-oxide-semiconductor transistor according to claim 13, further comprising source/drain regions, which are formed in the substrate and made of silicon germanium (SiGe) or silicon carbide (SiC).

* * * * *